United States Patent
Pelella et al.

(10) Patent No.: US 6,830,987 B1
(45) Date of Patent: Dec. 14, 2004

(54) SEMICONDUCTOR DEVICE WITH A SILICON-ON-VOID STRUCTURE AND METHOD OF MAKING THE SAME

(75) Inventors: Mario P. Pelella, Mountain View, CA (US); Srinath Krishnan, Campbell, CA (US); William G. En, Milpitas, CA (US); Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/460,160

(22) Filed: Jun. 13, 2003

(51) Int. Cl.[7] .......................... H01L 21/76; H01L 21/00

(52) U.S. Cl. ................................. 438/421; 438/149

(58) Field of Search ............................ 438/149, 164, 438/196, 201, 197, 155, 154, 152, 153, 421, 50, 52, 53

(56) References Cited

U.S. PATENT DOCUMENTS

| | | | | | |
|---|---|---|---|---|---|
| 5,689,087 | A | * | 11/1997 | Jack | 136/213 |
| 5,811,315 | A | * | 9/1998 | Yindeepol et al. | 438/405 |
| 6,200,866 | B1 | * | 3/2001 | Ma et al. | 438/299 |
| 6,396,113 | B1 | * | 5/2002 | Fujinaga et al. | 257/397 |
| 6,548,364 | B2 | * | 4/2003 | Hsu | 438/311 |
| 6,563,173 | B2 | * | 5/2003 | Bolam et al. | 257/349 |
| 6,744,113 | B2 | * | 6/2004 | Kuroi et al. | 257/510 |
| 2002/0017689 | A1 | * | 2/2002 | Hirano et al. | 257/351 |
| 2002/0115268 | A1 | * | 8/2002 | Jang | 438/480 |
| 2003/0062332 | A1 | * | 4/2003 | Harris et al. | 216/2 |
| 2004/0126985 | A1 | * | 7/2004 | Bendernagel et al. | 438/411 |

* cited by examiner

*Primary Examiner*—Matthew Smith
*Assistant Examiner*—Chuong Anh Luu

(57) ABSTRACT

An SOI semiconductor and method for making the same includes a substrate and dielectric support structures that support a silicon body above the substrate. This creates a void underneath the silicon body and thereby reduces the capacitance between the source/drain regions on body and the substrate.

12 Claims, 5 Drawing Sheets

SEMICONDUCTOR DEVICE WITH A SILICON-ON-VOID STRUCTURE AND METHOD OF MAKING THE SAME

FIELD OF THE INVENTION

The present invention relates to the field of semiconductor manufacturing, and more particularly, to the formation of a silicon-on-insulator structure with improved capacitance characteristics.

BACKGROUND OF THE INVENTION

Silicon-on-insulator (SOI) metal-oxide semiconductor field effect transistors (MOSFETs) are well known in the field of semiconductors. SOI MOSFETs have been demonstrated to be superior to bulk silicon MOSFETs in low-power, high-speed, very large scale integration (VLSI) applications. Some of the advantages include (1) less junction capacitance so that higher circuit speed can be achieved; (2) better device isolation; and (3) sufficient radiation hardness.

A conventional SOI structure comprises a substrate made of silicon, for example. An insulator layer is formed over the substrate, and is typically an oxide, such as silicon oxide. A silicon body, or silicon island, is formed on the insulator layer. This causes the insulator layer to be a "buried oxide" layer or BOX layer. The silicon bodies are isolated from one another by shallow trench isolation (STI) regions or other isolation regions. The source/drain regions are formed in the silicon body and the gate electrode is formed on top of the silicon body, thus forming the MOSFET device.

One of the limiting factors in transistor performance in SOI devices is the capacitance that exists from the source/drain regions to the substrate. The typical dielectric constant of the oxide that is conventionally used as the insulator layer of SOI devices is approximately 3.9. Reduction in the capacitance from the source/drain regions to the substrate will improve overall performance of the device by lowering the RC time constant.

SUMMARY OF THE INVENTION

There is a need for a SOI device that exhibits reduced capacitance between the source/drain regions and the substrate.

These and other needs are met by embodiments of the present invention which provide a semiconductor device comprising a substrate, dielectric support structures, and a silicon body held between the dielectric support structures and above the substrate such that a void is formed between the silicon body and the substrate.

The void between the silicon body and the substrate, as provided by the present invention, has the advantage of presenting a reduced dielectric constant and thereby reduction in the capacitance between source/drain regions and the substrate. For example, the dielectric constant of air is equal to one, which is significantly lower than the dielectric constant for silicon dioxide (approximately 3.9). The reduced capacitance improves the overall performance of the device of the present invention.

The earlier stated needs are also met by embodiments of the present invention which provide a method of forming a semiconductor device comprising the steps of forming a silicon-on-insulator precursor including a substrate, a buried oxide layer on the substrate, a silicon body on the buried oxide layer, and isolation regions surrounding the periphery of the silicon body. The portions of the buried oxide layer that are under the silicon body are etched to create a void between the substrate and the silicon body.

The etching of portions of the buried oxide layer in accordance with the embodiments of the present invention serves to create the void that provides the reduced dielectric constant between the source/drain regions and the substrate. The etching allows the creation of the void in a production-worthy method.

The earlier stated needs are also met by embodiments of the present invention which provide a method of forming a semiconductor device comprising the steps of forming a SOI structure having a substrate, an insulator on the substrate, a silicon body on the insulator, and isolation regions surrounding the periphery of the silicon body. In this method, a void is formed in the insulator layer between the silicon body and the substrate.

The foregoing and other features, aspects and advantages of the present invention will become more apparent from the following detailed description when taken in conjunction with the accompanying drawings.

DETAILED DESCRIPTION OF THE INVENTION

The present invention addresses problems related to the formation of SOI devices, and the capacitance between the source/drain regions and the substrate in SOI devices. The present invention improves upon the conventional devices by reducing the capacitance between the source/drain regions and the substrate. This is achieved, in part by the formation of a void underneath the silicon body of an SOI structure. The silicon body is supported by dielectric support structures, maintaining the void between the silicon body and the substrate. Since the air in the void has a much lower dielectric constant than the typical oxide employed in the insulator layer of an SOI structure, the capacitance between the source/drain regions and the substrate is significantly reduced.

Figure 1A:
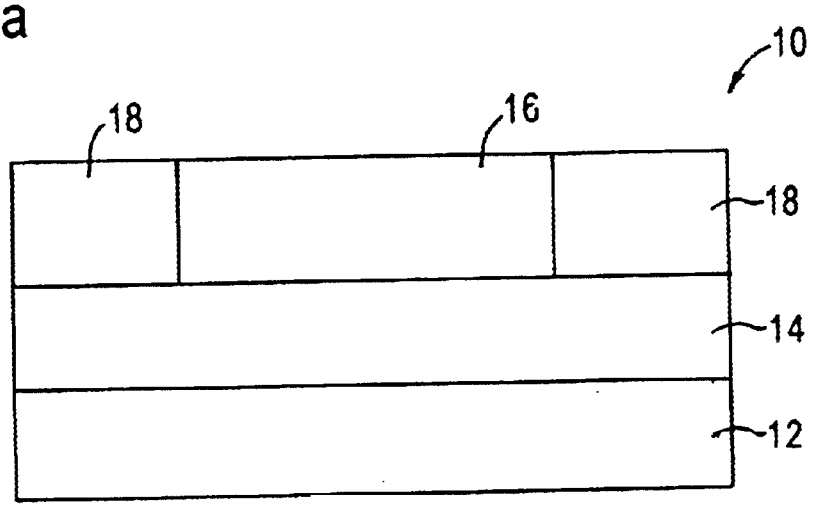
FIG. 1A is a cross-section of a silicon-on-insulator (SOI) precursor formed in accordance with embodiments of the present invention.

FIG. 1A depicts the cross-section of a silicon-on-insulator (SOI) precursor constructed in accordance with embodiments of the present invention. A precursor 10 may be formed in a conventional manner and includes a silicon substrate 12, formed of bulk silicon. An insulator layer 14, or buried oxide layer, is provided on the substrate 12. A silicon body 16 is provided on the buried oxide (BOX) layer 14. This silicon body 16 forms an island, or a silicon island, as it is surrounded on its periphery by isolation regions 18. These isolation regions 18 may be formed of oxide, for example. A shallow trench isolation (STI) technique may be employed to form the isolation regions 18.

Figure 1B:
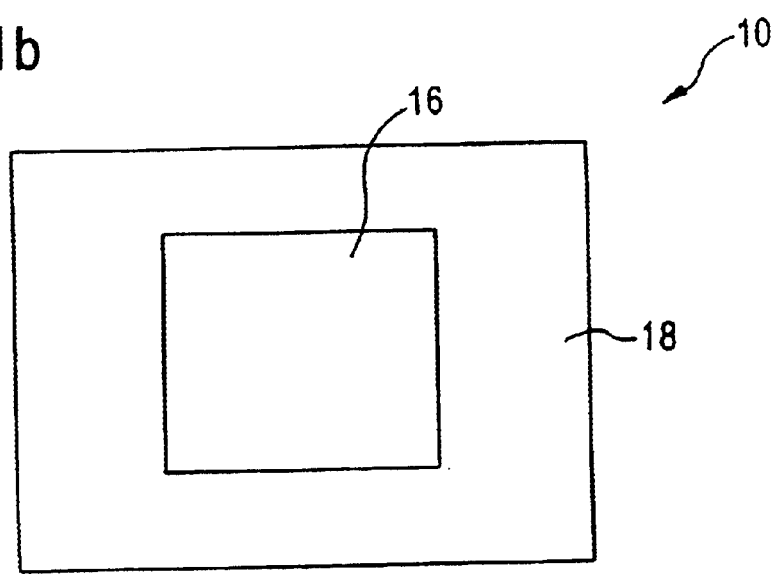
FIG. 1B is a top view of the SOI precursor of FIG. 1A.

Conventional methodologies may be employed to create the precursor 10, such as SIMOX and others. A top view of the SOI precursor 10 is provided in FIG. 1B.

Figure 2A:
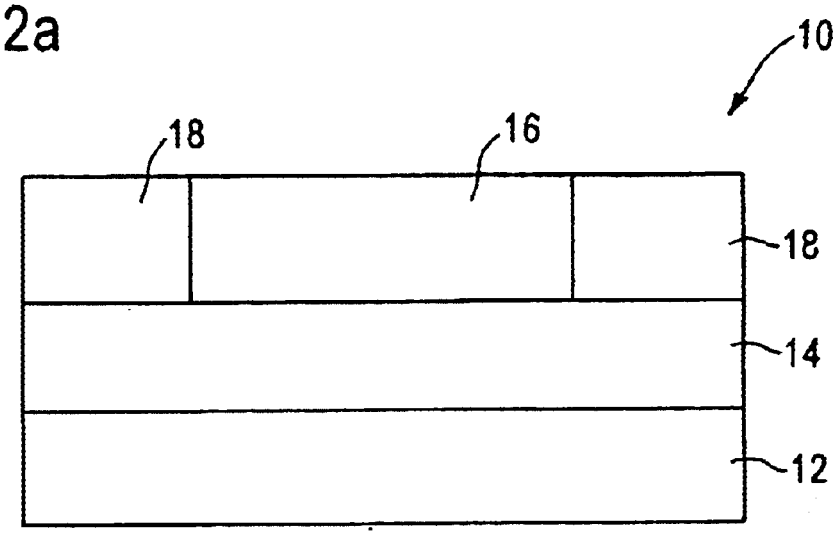
FIG. 2A depicts the structure of FIG. 1A following the formation of an etch mask in accordance with embodiments of the present invention.
Figure 2B:
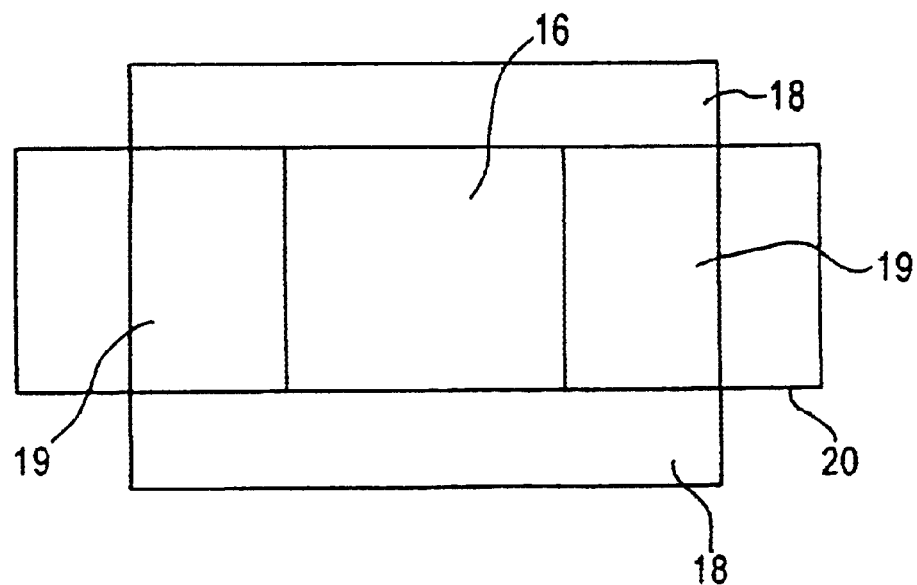
FIG. 2B depicts the top view of the structure of FIG. 2A after the wet etch mask has been formed.

FIG. 2A shows the SOI precursor 2A as it is exposed by a mask 20, depicted in FIG. 2B. The mask 20 is a wet etch mask.

The isolation regions 18 that are not covered by the mask 20 will not be etched during the wet etching procedure. The wet etch mask 20 exposes portions 19 of the isolation regions 18 to the etchant. The silicon body 16 is also exposed to the etchant. A suitable etchant is employed that is highly selective to etch the oxide in the portions 19 of the isolation regions 18 that are exposed by the mask 20, and not etch the silicon body 16. A suitable exemplary etch is a buffered oxide etch (BOE) well known to those of ordinary skill in the art for preferentially etching oxide and maintaining the silicon intact.

Figure 3A:
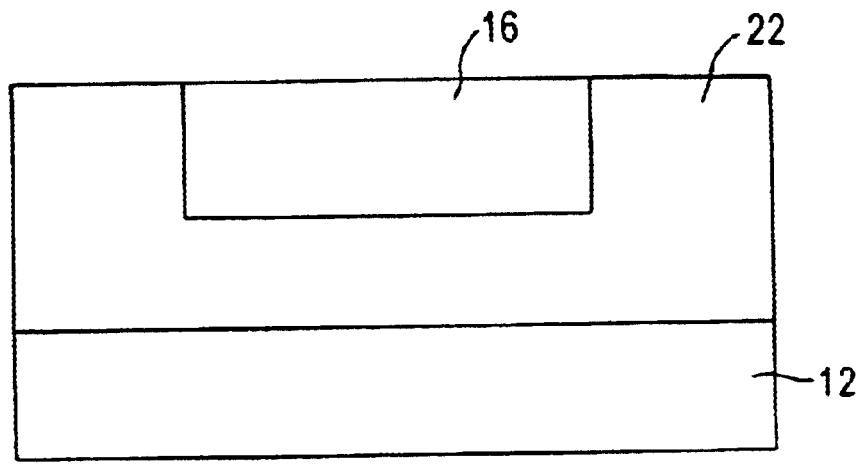
FIG. 3A shows the structure of FIG. 2B following a wet etch procedure formed in accordance with embodiments of the present invention.
Figure 3B:
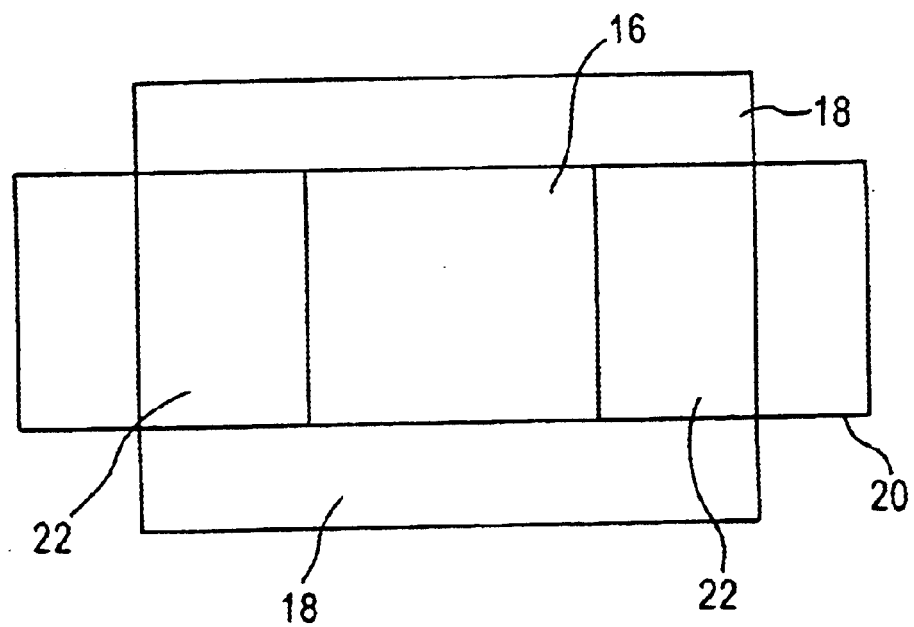
FIG. 3B depicts a top view of the structure of FIG. 3A with a mask in place.

The results of the wet etch step are depicted in FIG. 3A and in FIG. 3B. The isolation regions 18 exposed by the mask 20 are etched through to create a void 22 that also extend underneath the silicon body 16.

The silicon body 16 is suspended by the isolation regions 18 that have not been etched. This can best be seen in FIG. 3B. At this point in the formation process, only two sides of the periphery of the silicon body 16 are contacted by the isolation regions 18, rather than all four sides.

Figure 4A:
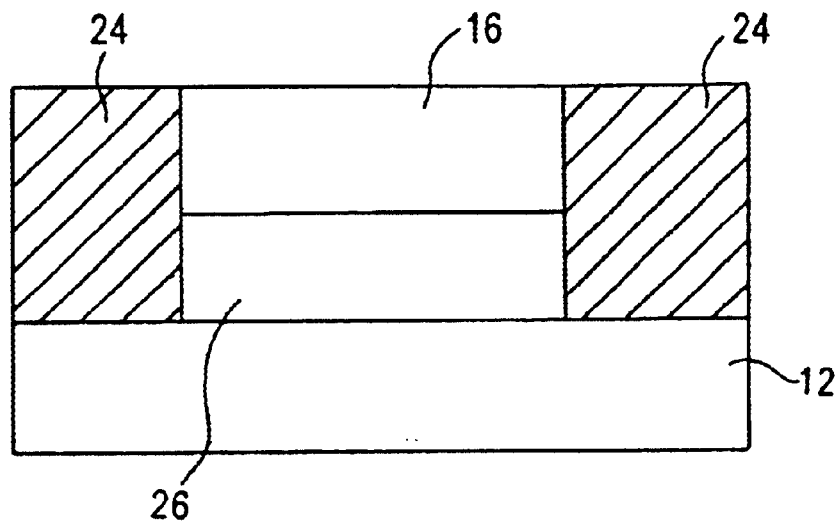
FIG. 4A depicts the structure of 3A following the formation of dielectric support structures in accordance with embodiments of the present invention.

In order to provide enhanced structural stability, dielectric support structures 24 are formed, as depicted in FIG. 4A. The dielectric support structures 24 are formed by deposition of a dielectric material, such as silicon dioxide, into the isolation regions 18 that were etched through. A conventional deposition technique, such as chemical vapor deposition, may be employed to deposit the dielectric support structures 24.

Figure 4B:
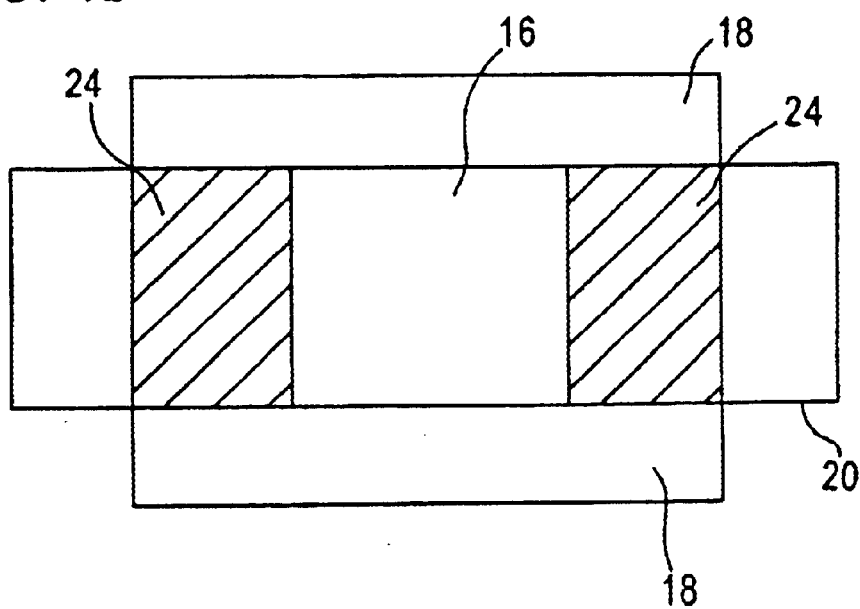
FIG. 4B shows the structure of FIG. 4A, with the mask in place.

The dielectric support structures 24, together with the isolation regions 18 that were not etched, securely support the silicon body 16 above the substrate 12, with a void 26 formed between the silicon body 16 and the substrate 12. The void 26 will contain air, which has a dielectric constant of one. This dielectric constant is much lower than that of the buried oxide material that was previously underneath the silicon body 16. This reduces the capacitance between the source/drain regions that will be formed in the silicon body 16 and the substrate 12. Improved performance of the SOI device is therefore a result. A top view of the SO structure and mask 20 is provided in FIG. 4B.

Following the formation of the dielectric support structures 24 and the void 26 underneath the silicon body 16, further processing may be performed in a conventional manner to complete the formation of an SOI device. An exemplary embodiment of an SOI device constructed in accordance with the present invention is provided in FIG. 5. Source/drain regions 28 are formed in the silicon body 16. A gate electrode 30 is provided on the silicon body 16, over a gate dielectric. Dielectric material 32 is formed over the gate electrode 30. Silicide regions 38 are provided on the source/drain regions 28 and the gate electrode 30. Sidewalls 34 are formed on the sides of the gate electrode 30. Contacts 36 may be formed through the dielectric layer 32 to the silicide regions 38.

Figure 5:
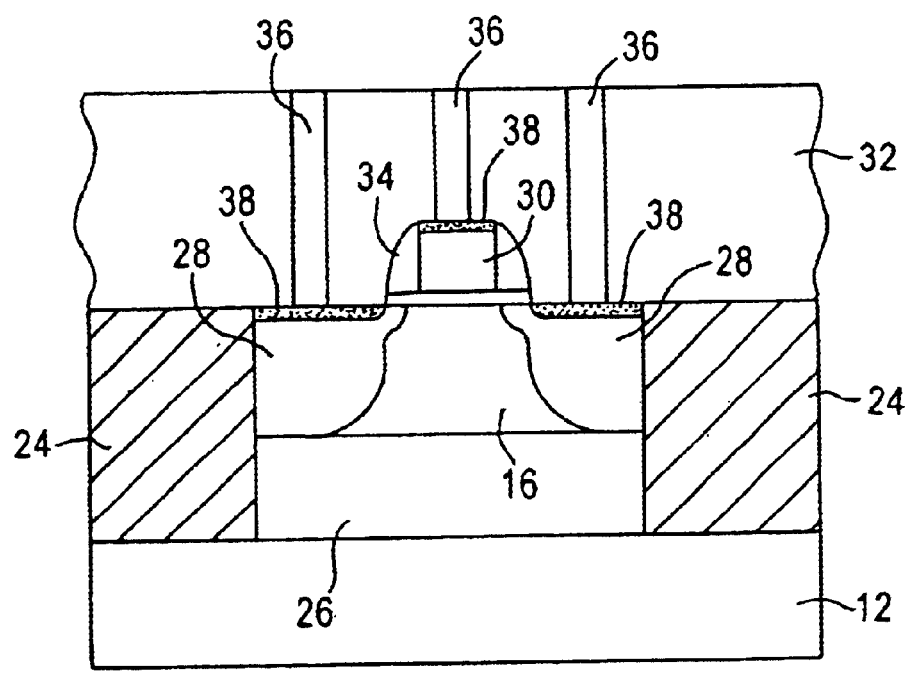
FIG. 5 shows the structure of FIG. 4A following further processing steps to form a MOSFET, in accordance with embodiments of the present invention.

The completed SOI device depicted in FIG. 5 exhibits reduced capacitance between the source/drain regions 28 and the substrate 12, due to the lower dielectric constant in the void 26 underneath the silicon body 16, as compared to conventional SOI structures in which the silicon body is on an oxide layer.

Although the present invention has been described and illustrated in detail, it is to be clearly understood that the same is by way of illustration and example only, and is not to be taken by way of limitation, the scope of the present invention be limited only by the terms of the appended claims.

What is claimed is:

1. A method of forming a semiconductor device, comprising the steps of:
   forming a silicon-on-insulator (SOI) precursor including a substrate, a buried oxide layer on the substrate, a silicon body on the buried oxide layer; and isolation regions surrounding the periphery of the silicon body;
   etching portions of the buried oxide layer under the silicon body to create a void between the substrate and the silicon body; and
   forming active regions in the silicon body and a gate electrode on the silicon body to form an operative semiconductor device having the void between the substrate and the silicon body.

2. The method of claim 1, further comprising forming dielectric support structures on the periphery of the silicon body.

3. The method of claim 2, wherein the step of etching portions of the buried oxide layer include etching through at least some of the isolation regions.

4. The method of claim 3, wherein the dielectric support structures are formed in place of the isolation regions that have been etched through.

5. The method of claim 4, wherein the dielectric support structures comprise $SiO_2$.

6. The method of claim 4, wherein the step of etching portions of the buried oxide layer includes performing a wet etch.

7. The method of claim 6, wherein the wet etch is a buffered oxide etch.

8. A method of forming a semiconductor device, comprising the steps of: forming an silicon-on-insulator (SOI) structure having a substrate, an insulator layer on the substrate, a silicon body on the insulator layer, and isolation regions surrounding the periphery of the silicon body;
   forming a void in the insulator layer between the silicon body and the substrate; and
   forming active regions in the silicon body and a gate electrode on the silicon body to form an operative semiconductor device having the void between the substrate and the silicon body.

9. The method of claim 8, wherein the step of forming a void includes etching the SOI structure with a wet etch to etch through portions of the isolation regions and etch the insulator layer between the silicon body and the substrate.

10. The method of claim 9, wherein the step of etching includes forming a mask over the SOI structure, the mask protecting at least some of the isolation regions from etching.

11. The method of claim 10, wherein the wet etch comprises a buffered oxide etch.

12. The method of claim 10, further comprising depositing a dielectric material on the SOI structure to replace the portions of the isolation regions that have been etched through the dielectric material forming support structures for the silicon body and extending to the substrate.

* * * * *